United States Patent
Park

(10) Patent No.: US 6,947,340 B2
(45) Date of Patent: Sep. 20, 2005

(54) MEMORY DEVICE FOR REDUCING SKEW OF DATA AND ADDRESS

(75) Inventor: San-Ha Park, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/732,144

(22) Filed: Dec. 9, 2003

(65) Prior Publication Data

US 2004/0219745 A1 Nov. 4, 2004

(30) Foreign Application Priority Data

Apr. 30, 2003 (KR) .............................. 10-2003-0027651

(51) Int. Cl.$^7$ ................................................ G11C 7/00
(52) U.S. Cl. .................. 365/194; 365/189.02; 365/233
(58) Field of Search ........................... 365/194, 189.02, 365/191, 233

(56) References Cited

U.S. PATENT DOCUMENTS

| | | | | |
|---|---|---|---|---|
| 5,214,609 A | * | 5/1993 | Nakai et al. ............ | 365/230.01 |
| 5,963,502 A | * | 10/1999 | Watanabe et al. ........... | 365/233 |
| 6,151,271 A | * | 11/2000 | Lee ............................. | 365/233 |
| 6,347,064 B1 | * | 2/2002 | Seo ............................. | 365/233 |
| 6,426,900 B1 | * | 7/2002 | Maruyama et al. ......... | 365/194 |
| 6,720,807 B1 | * | 4/2004 | Kubo et al. ................. | 327/141 |

* cited by examiner

*Primary Examiner*—Son Mai
(74) *Attorney, Agent, or Firm*—Blakely, Sokoloff, Taylor & Zafman

(57) ABSTRACT

A semiconductor memory device operates at a high speed regardless of variance of power voltage or process change, by consistently keeping variance of the skew between the transfer path of the address and the transfer path of internal operation of the memory device. The semiconductor memory device comprises a memory core for outputting data corresponding an inputted address, a data output buffer for outputting the data that is outputted from the memory core to external, a data transferring unit for transferring the data that is outputted from the memory core to the data output buffer in response to an internal address, and an address transferring unit for receiving the address and passing the received address through an address transfer path that copies a data transfer path through which the data is transferred by the data transferring unit to output the address as the internal address.

8 Claims, 9 Drawing Sheets

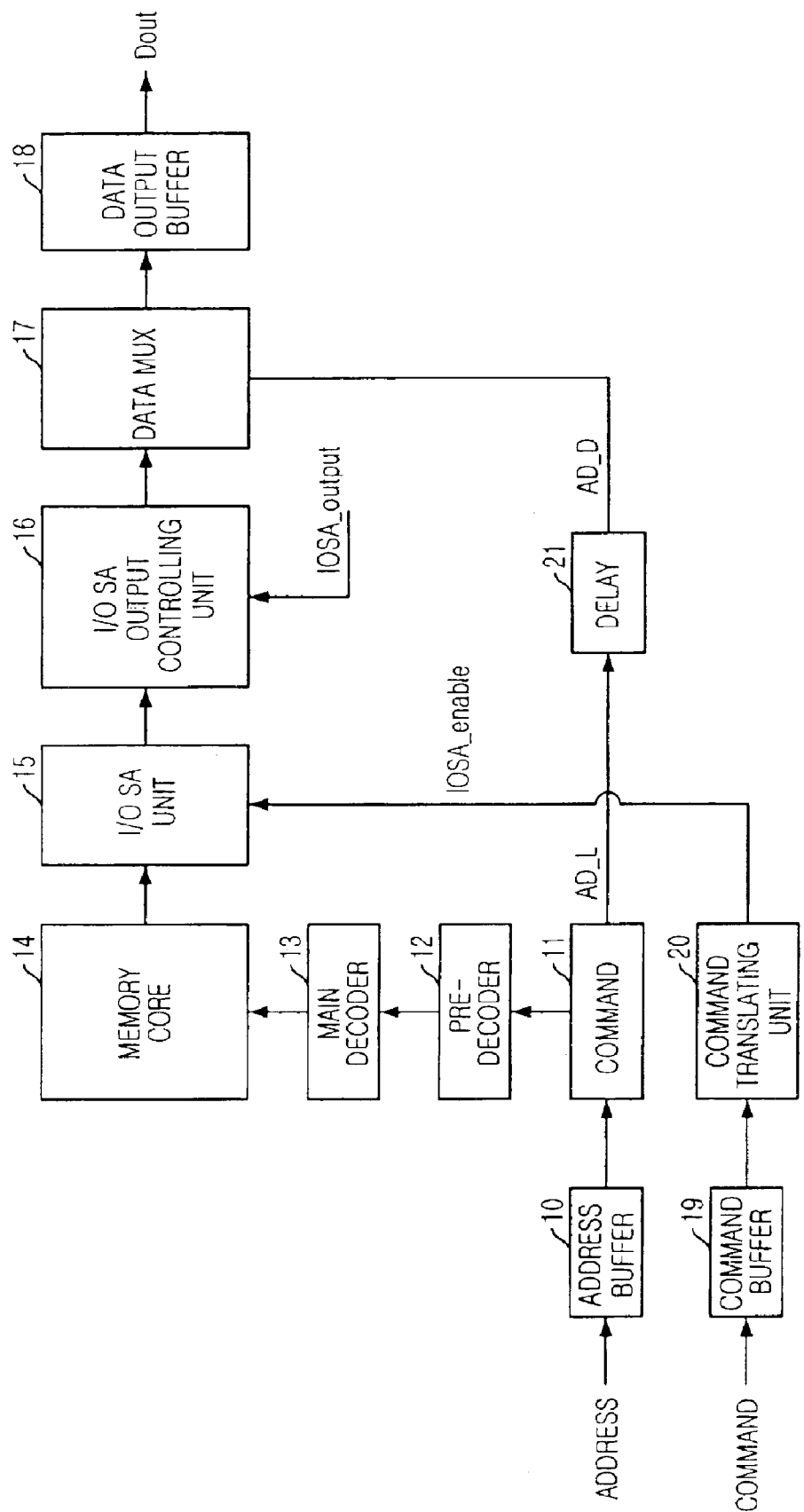

US 6,947,340 B2

MEMORY DEVICE FOR REDUCING SKEW OF DATA AND ADDRESS

FIELD OF THE INVENTION

The present invention relates to a semiconductor memory device; and, more particularly, to a semiconductor memory device capable of reducing a skew of a data signal and an address signal.

BACKGROUND OF THE INVENTION

FIG. 1 is a block diagram of a memory device in the prior art.

Referring to FIG. 1, the conventional memory device comprises a command buffer 19 for receiving and buffering a command signal, a command translating unit 20 for translating the command signal that is buffered at the command buffer 19, an address buffer 10 for receiving and buffering an address, an address latching unit 11 for receiving and latching the address that is buffered at the address buffer 10, a pre-decoder 12 for pre-decoding the address that is latched by the address latching unit 11, a main decoder 13 for decoding the address that is pre-decoded by the pre-decoder 12, a memory core 14 having a number of unit cells for outputting data that is stored at one of the unit cell which is selected by the address that is decoded by the main decoder 13, an I/O sense amplifying unit 15 for sensing and amplifying the data signal that is outputted from the memory core 14, an I/O sense amplifier output controlling unit 16 for controlling output of the data that is sensed and amplified at the I/O amplifying unit 15, a multiplexer 17 for receiving the data that is outputted from the I/O sense amplifier output controlling unit 16 to output the data that is multiplexed depending on x4, x8 or x16 mode, and a data output buffer 18 for adjusting the latency of the data that is outputted from the data multiplexer 17 to output the data to external.

FIGS. 2A and 2B show circuit diagrams of a delay 29 shown in FIG. 1, in which the address that is latched by the address latching unit 11 is delayed by a predetermined time to be outputted to the data multiplexer 17. The delay 21 may be constituted with serially coupled inverters, or a RC delay of a resistor and a capacitor, as shown in FIGS. 2A and 2B.

FIG. 3 offers a partial circuit diagram of an I/O sense amplifying unit shown in FIG. 1.

Referring to FIG. 3, the I/O sense amplifier unit 15 senses and amplifies a number of data lines through which a number of data are inputted from the memory core 14, respectively, to transfer the data to the I/O sense amplifier output controlling unit 16. Describing more in detail, the I/O sense amplifier 15 includes a connecting unit 15_1 for connecting the data lines IO, /IO, through which the data are inputted from the memory core 14, to a sense amplifier 15-3 in response to a connection/disconnection signal (ISO), a pre-charging unit 15_2 for pre-charging the two IO lines IO, /IO to a pre-charge voltage, the I/O sense amplifier 15_3 for sensing and amplifying the voltage on the IO line, and a data outputting unit 15_4 for latching and transferring the data signal that is sensed and amplified by the I/O sense amplifier 15_3.

FIG. 4 provides a partial circuit diagram of an I/O sense amplifier output controlling unit shown in FIG. 1.

Referring to FIG. 4, the I/O sense amplifier output controlling unit 16 outputs the data signal A that is outputted from the I/O sense amplifier unit 15 to the data multiplexer 17 in response to an I/O sense amplifier output enable signal IOSA_output. Describing more in detail, the I/O sense amplifier output controlling unit 16 includes an inverter I3 for receiving the I/O sense amplifier output enable signal IOSA_output, an inverter I4 serially coupled to the inverter I3, 3-stage inverters I5, I6 for transferring the data signal A that is outputted from the I/O sense amplifying unit 15 depending on the output signal of the inverters I3, I4, a MOS transistor MP5 for receiving the output of the 3-stage inverter I5 at its gate and a power voltage VDD at its one end to make its output to a high level, and a MOS transistor MN11 for receiving the output of the 3-stage inverter I6 at its gate and a ground voltage VSS at its one end to make its output to a low level. Further, the I/O sense amplifier output controlling unit 16 includes a MOS transistor MP4 for receiving the signal from the inverter I3 at its gate to transfer the power voltage VDD to the gate of the MOS transistor MP5, and a MOS transistor MP4 for receiving the signal from the inverter I4 at its gate to transfer the power voltage VDD VSS to the gate of the MOS transistor MP5.

Here, the 3-stage inverters I5, I6 are enabled when the output signal of the inverter I4 is in the low level and the output signal of the inverter I3 is in the high level.

FIG. 5A to 5C represent waveform diagrams for explaining the operation of the memory device shown in FIG. 1.

It will be described for the operation of the memory device in the prior art with reference to FIG. 1 to FIG. 4 and FIG. 5A to 5C.

First, when the address is inputted to the memory device to read the data, the command is buffered at the command buffer 19 and then outputted to the command translating unit 20 where the inputted command is translated.

Also, the address is buffered at the address buffer 10 and then inputted to the address latching unit 11 where the address is latched and is outputted to the pre-decoder 12 and the delay 21.

The pre-decoder 12 pre-decodes the inputted address and then outputs the pre-decoded address to the main decoder 13 where decodes once again the pre-decoded address to output it to the memory core 14. The memory core 14 selects one of the unit cells depending on the decoded value from the main decoder 13 and outputs the data that is stored at the selected unit cell. Here, address decoding is performed in the two stages to prevent a decoder from having a large area, because the more integrated the memory device becomes, the more number of address signals are to be decoded.

Further, the I/O sense amplifying unit 15 senses and amplifies the data signal that is inputted to the I/O line depending on the I/O sense amplifier enable signal IOSA_ enable from the command translating unit 20 to output it to the I/O sense amplifier output controlling unit 16.

The data that is inputted to the I/O sense amplifier output controlling unit 16 is outputted to the data multiplexer 17 in response to the output enable signal IOSA_output.

On the other hand, the address AD_L that is latched by the address latching unit 11 is delayed by the delay 21 by the predetermined time to be outputted as a delayed address AD_D to the data multiplexer 17.

The data multiplexer 17 outputs the data that is transferred from the I/O sense amplifier output controlling unit 16 to the data output buffer 18 depending on the delayed address AD_D. The data output buffer 18 adjusts the latency of the data from the data multiplexer 17 by the corresponding read command to output it to external.

FIG. 5A is a waveform diagram for explaining the operation when the power voltage VDD is in a normal status, e.g., when the operation voltage is 3.3 v, the actually inputted power voltage is 3.3 v, in the memory device shown in FIG. 1.

The address corresponding to the inputted read command Read is outputted to the address latching unit 11 as the address AD that is buffered by the address buffer 19. The address AD_L that is latched by the address latching unit 11 is outputted as the address AD_D that is delayed by the delay 21 to be outputted to the data multiplexer 17.

On the other hand, the I/O sense amplifying unit 15 is enabled by the I/O sense amplifier enable signal IOSA_ enable that is outputted from the command translating unit 20 to sense and amplify the data signal on the I/O line. The sensed and amplified data is outputted to the data multiplexer 17 through the I/O sense amplifier output controlling unit 16.

At this time, the reason for making the delayed address AD_D by passing the latched address AD_L through the delay 21 is to adjust the skew between the address that is inputted into the data multiplexer 17 and the data that is inputted from the previous I/O sense amplifier output controlling unit 16.

Accordingly, the margin between the data that is transferred from the I/O sense amplifier output controlling unit 16 and the latched address is adjusted by the delay 21. As described above, the delay 21 may be constituted with the serially coupled inverters or the RC delay.

Here, tAA(Column Address Access Time) means a column address access time, i.e., the margin from input of the delayed address AD_D to input of the data into the data multiplexer 17. Also, tCCD(Column Address Dealy Time) means a column address delay time, i.e., the margin from transfer of the data from the I/O sense amplifier output controlling unit 16 to the end of input of the delayed address AD_D.

The timing shown in FIG. 5A describes the normal operation when the expected power voltage VDD is normally inputted to the operation voltage.

However, when the inputted power voltage VDD is lower or higher than the operation voltage, i.e., when the inputted power voltage VDD varies, the varying skew between the address signal that is inputted to the data multiplexer 17 and the data that is transferred from the I/O sense amplifier output controlling unit 16 could not be perfectly adjusted by only the simple delay 21 due to the circuits of each block on the data transfer path and parasitic capacitance/parasitic resistance.

Further, the skew between the address signal that is inputted to the data multiplexer 17 and the data that is transferred from the I/O sense amplifier output controlling unit 16 can vary due to the manufacturing process of the memory device, which could not be adjusted by that simple delay, either.

FIG. 5B shows a waveform diagram for explaining the operation when the power voltage VDD is lower than the operation voltage.

When the power voltage VDD is lower than the expected operation voltage, e.g., when the power voltage is 3.0 v while the operation voltage is 3.3 v, the timing at the delayed address AD_D is inputted to the data multiplexer 17 is later than the normal case because the delay time for the address during the delay 21 increases.

As shown in FIG. 5B, because the delayed address AD_D is inputted to the data multiplexer 17 lately, the margin of tAA becomes almost disappeared.

On the other hand, FIG. 5C shows a waveform diagram for explaining the operation when the power voltage VDD is higher than the operation voltage.

When the power voltage VDD is higher than the expected operation voltage, e.g., when the power voltage is 3.6 v while the operation voltage is 3.3 v, the timing at the delayed address AD_D is inputted to the data multiplexer 17 is earlier than the normal case because the delay time for the address during the delay 21 decreases.

As shown in FIG. 5C, because the delayed address AD_D is inputted early to the data multiplexer 17 compared with the normal case, the margin of tCCD becomes almost disappeared.

The above problem occurs because the characteristics of the parasitic capacitance and the parasitic resistance of the delay 21 that delays the latched address become different from those of the transfer path of the data from the memory core due to the variance of the power voltage that is inputted as the operation voltage. Also, the problem could occur because of the variance of the delay due to the process as well as the power voltage.

Accordingly, it makes it impossible to develop a memory device operating at a high speed because the variance of the power voltage or the manufacture process have effect on the variance of the skew due to difference between the data transfer path and the address transfer path.

SUMMARY OF THE INVENTION

It is, therefore, a primary object of the present invention to provide a semiconductor memory device capable of operating at a high speed regardless of variance of power voltage or process change, by consistently keeping variance of the skew between the transfer path of the address and the transfer path of internal operation of the memory device.

In accordance with the present invention, there is provided a semiconductor memory device of the present comprises a memory core for outputting data corresponding an inputted address; a data output buffer for outputting the data that is outputted from the memory core to external; a data transferring unit for transferring the data that is outputted from the memory core to the data output buffer in response to an internal address; and an address transferring unit for receiving the address and passing the received address through an address transfer path that copies a data transfer path through which the data is transferred by the data transferring unit to output the address as the internal address.

BRIEF DESCRIPTION OF THE DRAWINGS

The above and other objects and features of the present invention will become apparent from the following description of preferred embodiments given in conjunction with the accompanying drawings, in which:

FIG. 1 is a block diagram of a memory device in the prior art;

DETAILED DESCRIPTION OF THE PREFERRED EMBODIMENTS

Hereinafter, with reference to the accompanying drawings, a preferred embodiment of the present invention will be explained in detail.

Figure 2A:
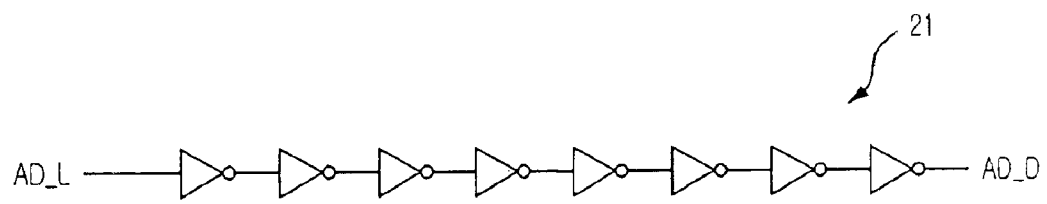
FIGS. 2A and 2B show circuit diagrams of a delay shown in FIG. 1.
Figure 2B:
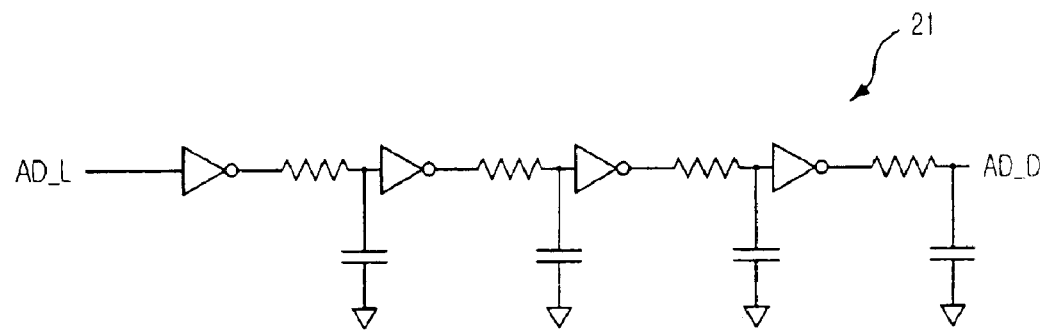
Figure 3:
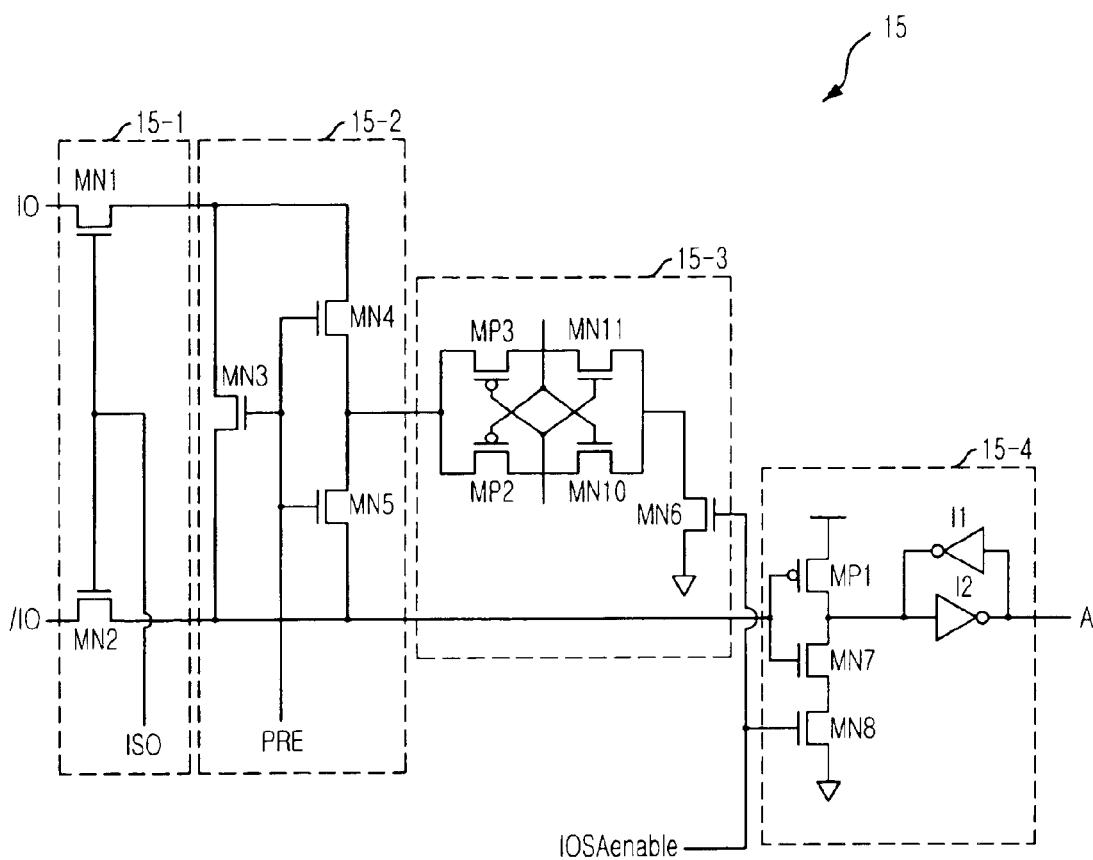
FIG. 3 offers a circuit diagram of an I/O sense amplifying unit shown in FIG. 1.
Figure 4:
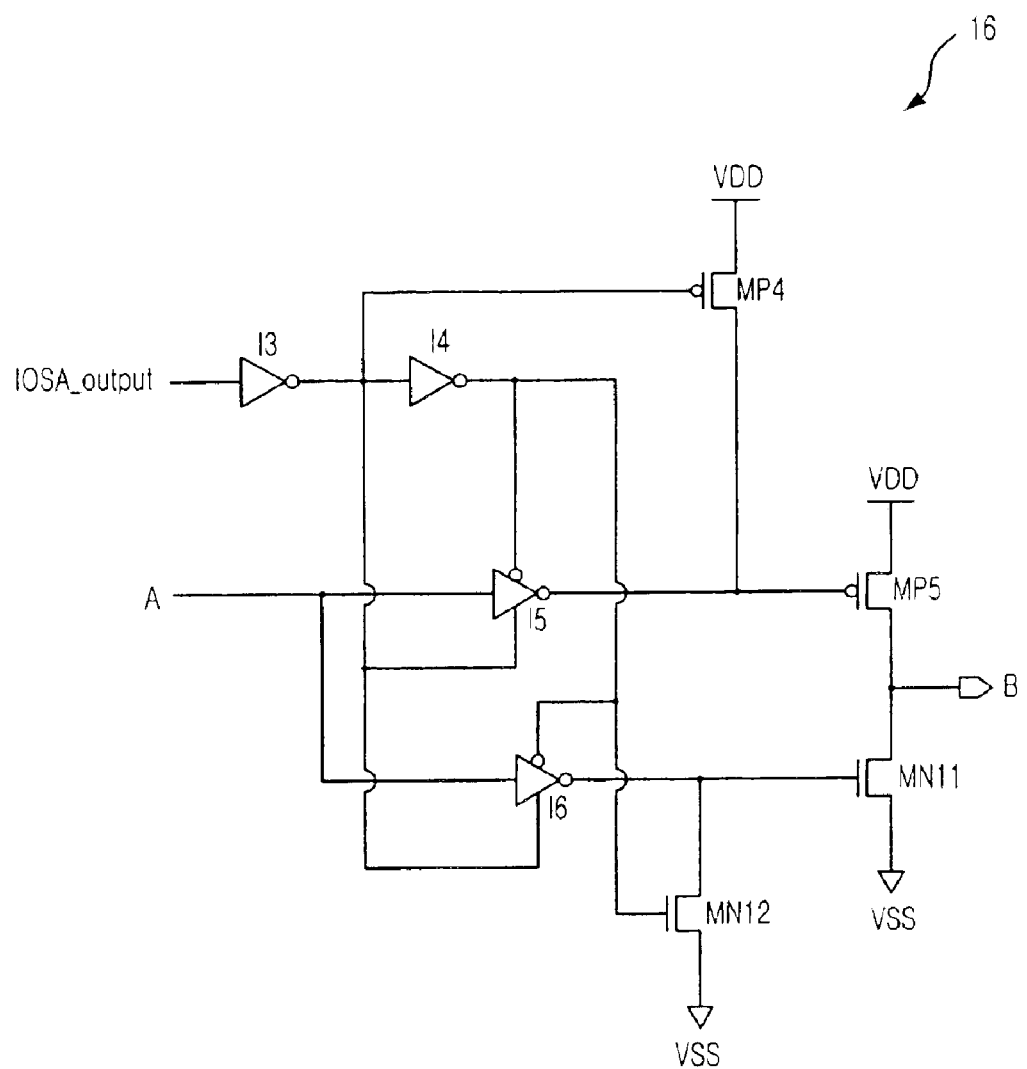
FIG. 4 provides a circuit diagram of an I/O sense amplifier output controlling unit shown in FIG. 1.
Figure 5A:
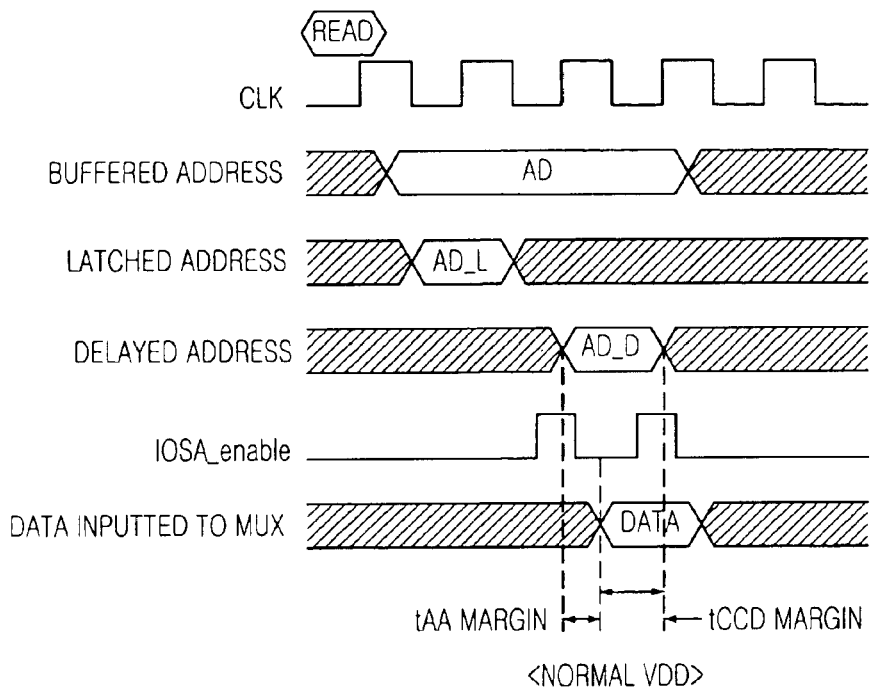
FIG. 5A to 5C represent waveform diagrams for explaining the operation of the memory device shown in FIG. 1.
Figure 5B:
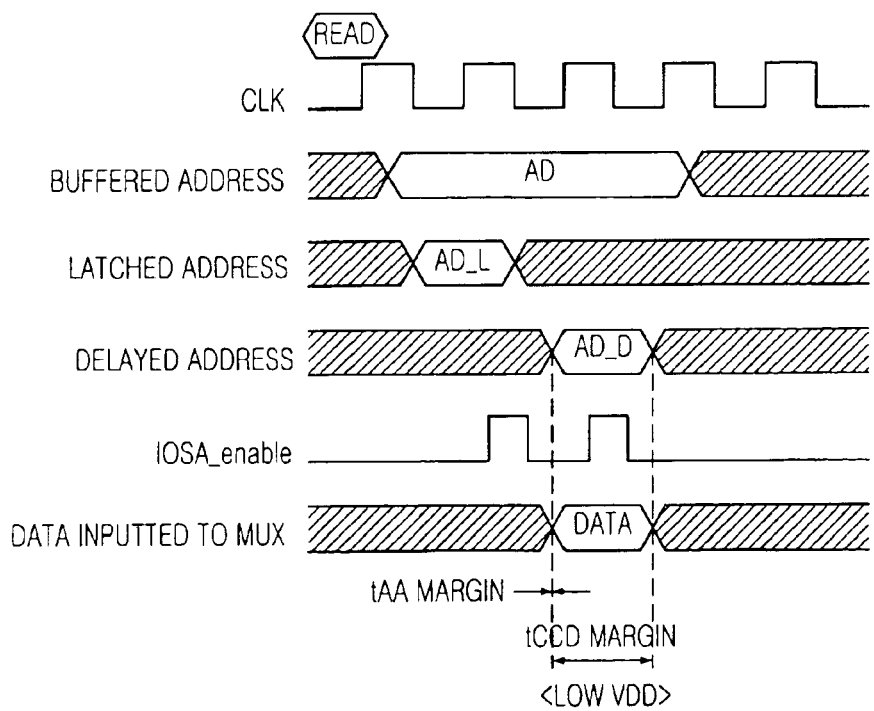
Figure 5C:
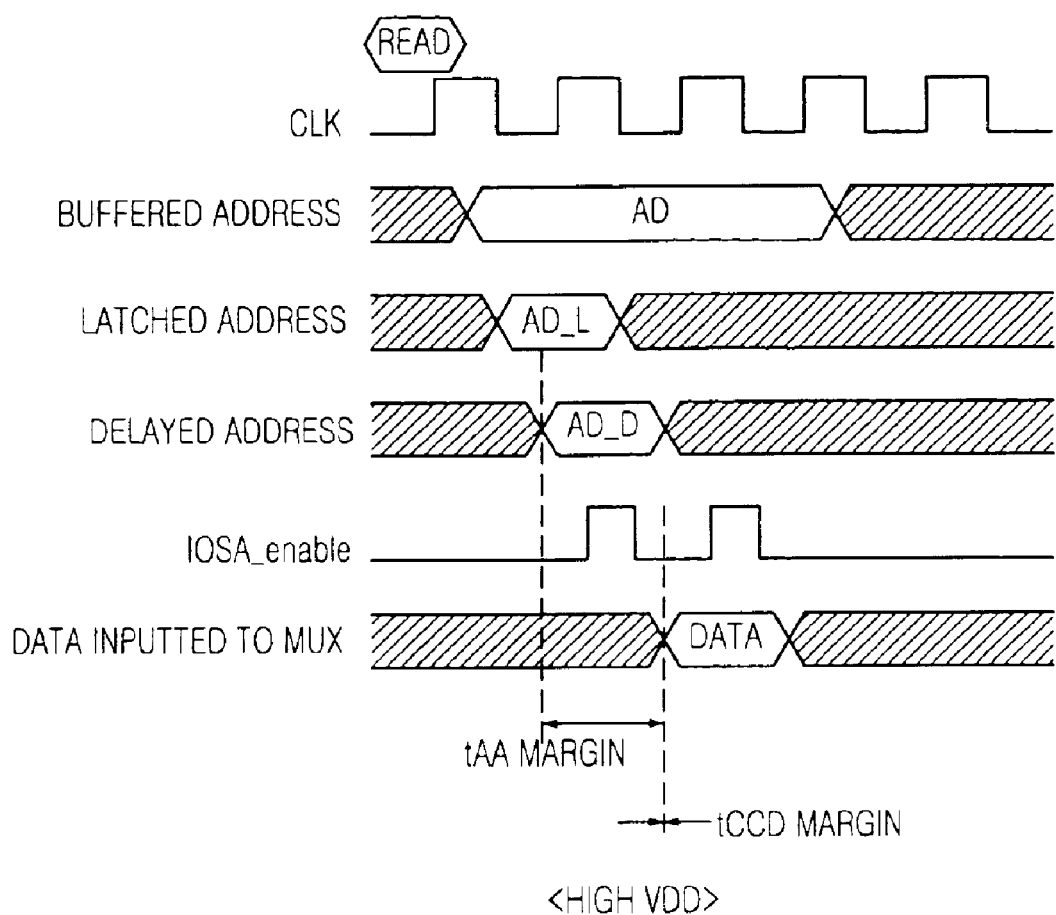
Figure 6:
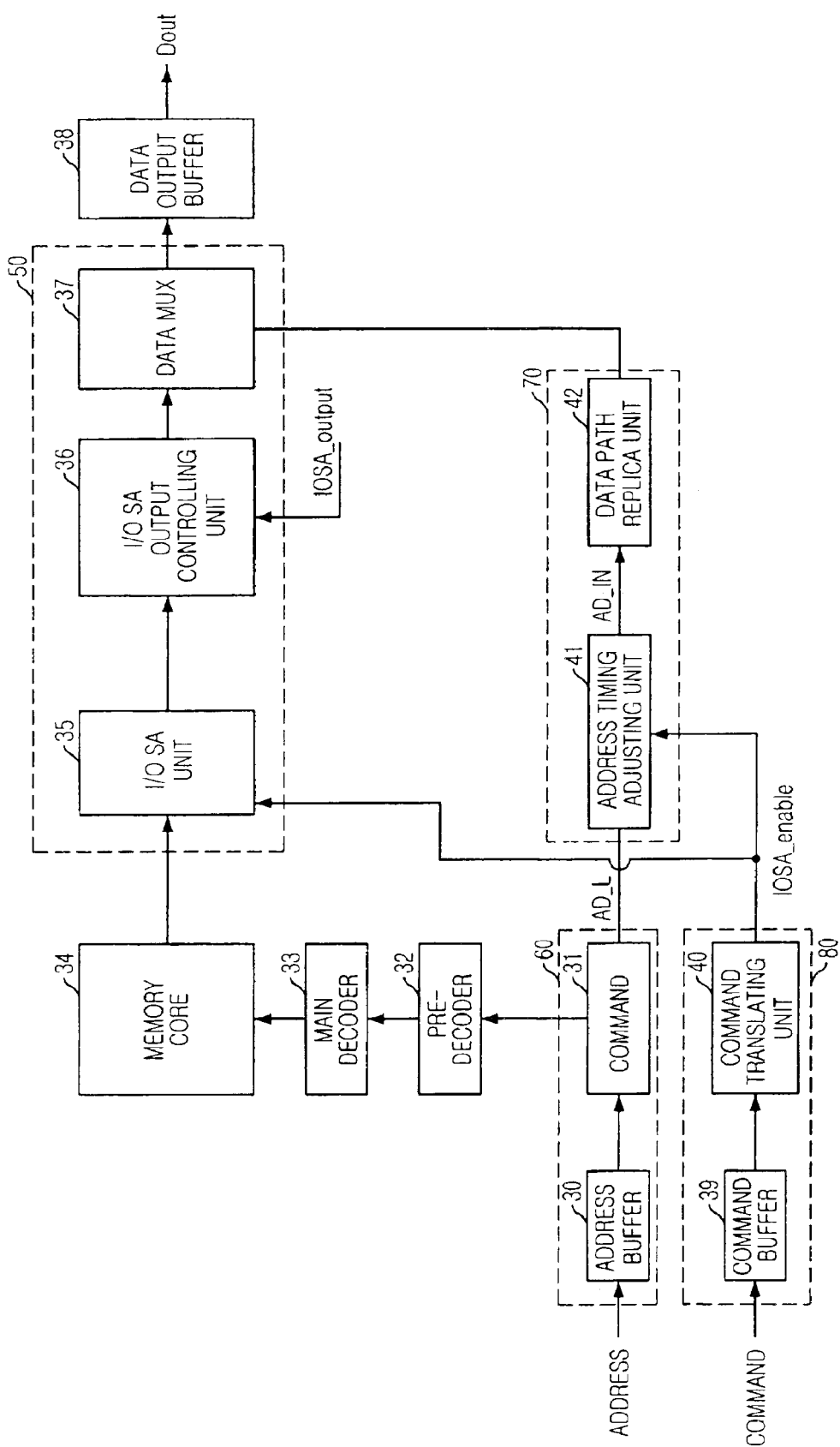
FIG. 6 illustrates a block diagram of a memory device in accordance with a preferred embodiment of the present invention.

FIG. 6 illustrates a block diagram of a memory device in accordance with a preferred embodiment of the present invention.

Referring to FIG. 6, the semiconductor memory device according to a preferred embodiment of the present invention comprises a memory core 34 for outputting data corresponding an inputted address, a data output buffer 38 for outputting the data that is outputted from the memory core 34 to external, a data transferring unit 50 for transferring the data that is outputted from the memory core 34 to the data output buffer 38 in response to an internal address AD_OUT, and an address transferring unit 70 for receiving the address AD and passing the received address AD through an address transfer path that copies a data transfer path through which the data is transferred by the data transferring unit 50 to output the passed address as the internal address AD_OUT.

The data transferring unit 50 includes an I/O sense amplifying unit 35 enabled by a sense amplifier enable signal IOSA_enable for sensing and amplifying the data from the memory core 34, a first I/O sense amplifier output controlling unit 36 for adjusting output timing of the data that is sensed and amplified by the I/O sense amplifying unit 35, and a data multiplexer 37 for outputting the data that is outputted by the first I/O sense amplifier output controlling unit 36 to the data output buffer 38 in response to the internal address AD_OUT.

The address transferring unit 70 includes an address timing adjusting unit 41 for receiving and transferring the address AD_L that is latched by the address buffering unit 30 in response to the sense amplifier enable signal IOSA_enable; and a data path replica unit 42 for passing the address that is transferred by the address timing adjusting unit 41 through an address transfer path that copies a data transfer path through which the data is transferred by the data transferring unit 50 to output the passed address as the internal address AD_OUT.

Also, the memory device according to the embodiment further includes a command translating unit 40 for generating the sense amplifier enable signal IOSA_enable by decoding a command that is inputted from external to output that signal to the I/O sense amplifying unit 35 and the address timing adjusting unit 41. The command from the external is buffered by a command buffer and outputted to the command translating unit 40.

Also, the memory device according to the embodiment further includes an address latching unit 31 for latching the inputted address AD to transfer the latched address to the memory core 34 or the address transferring unit 70.

Figure 7:
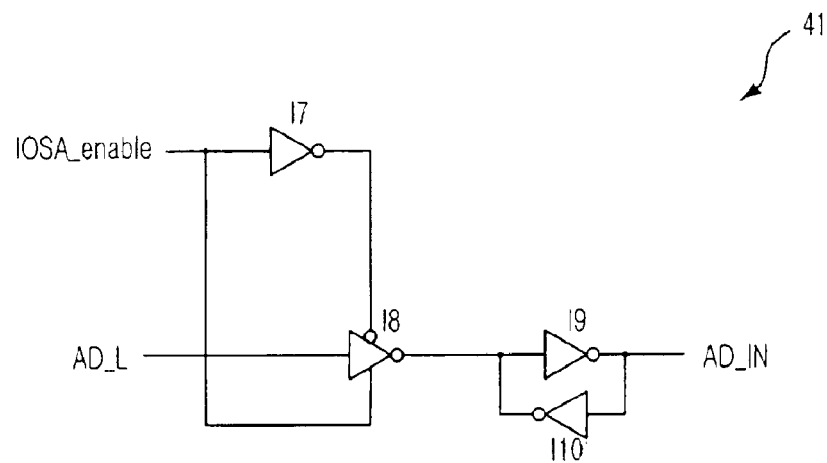
FIG. 7 shows a circuit diagram of an address timing adjusting unit shown in FIG. 6.

FIG. 7 shows a circuit diagram of an address timing adjusting unit shown in FIG. 6.

Referring to FIG. 7, the address timing adjusting unit 41 includes a 3-stage inverter I8 turned on in response to the sense amplifier enable signal IOSA_enable to transfer the address AD_L, and a first and a second inverters I9, I10 for latching the output of the 3-stage inverter I8.

Figure 8:
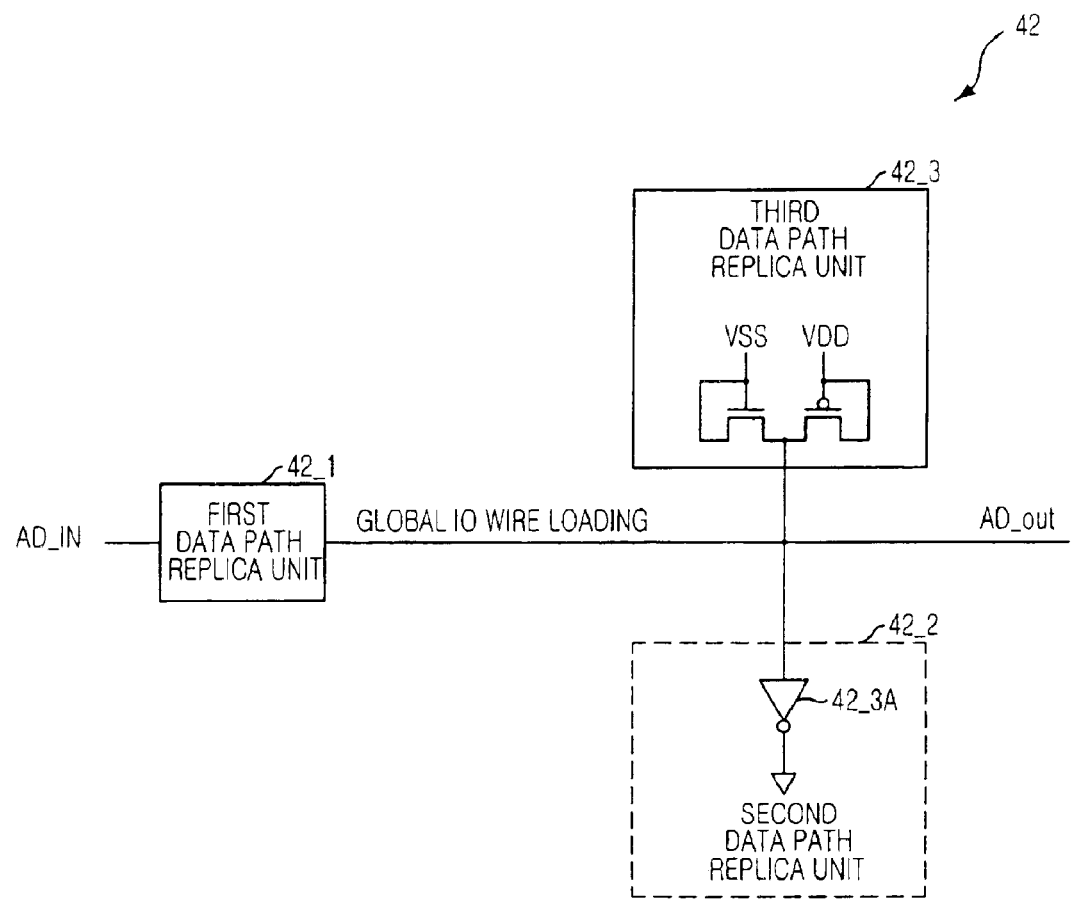
FIG. 8 provides a block diagram of a data path replica unit shown in FIG. 6.

FIG. 8 provides a block diagram of a data path replica unit shown in FIG. 6.

Referring to FIG. 8, the data path replica unit 42 includes a first data path replica unit 42_1 for transferring the address that is transferred by the address timing adjusting unit 41 through a first address transfer path that copies the path through which the data is transferred by the first I/O sense amplifier output controlling unit 35, and and a second data path replica 42_2 for transferring the address that is transferred by the first data path replica unit 42_1 through a second address transfer path that copies the path through which the data is transferred by the data multiplexer 37 to output the passed address as the internal address AD_OUT.

Figure 9:
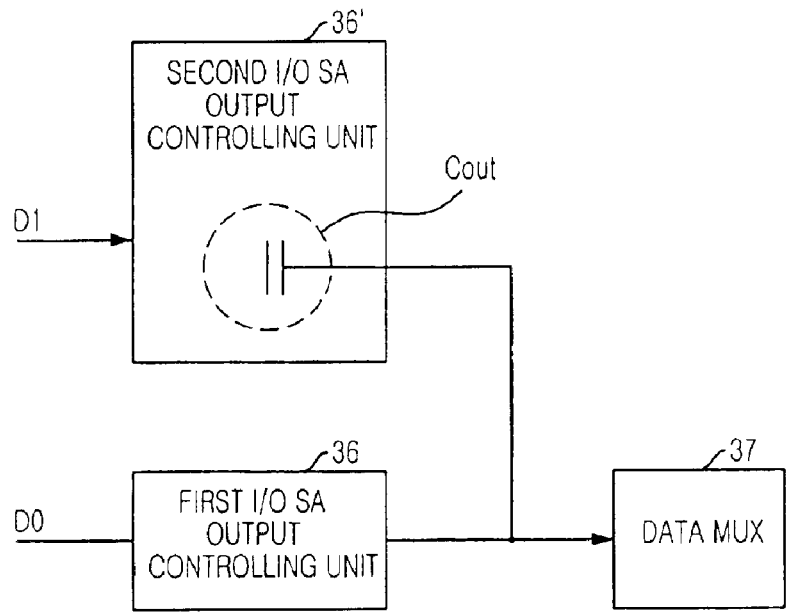
FIG. 9 is a block diagram of a capacitance corresponding to a third data path replica unit shown in FIG. 8.

FIG. 9 is a block diagram of a capacitance corresponding to a third data path replica unit shown in FIG. 8.

Referring to FIG. 8 and FIG. 9, the data multiplexer 37 is coupled to a second I/O sense amplifier output controlling unit 36' that is included in another bank in addition to the first I/O sense amplifier output controlling unit 36, and the data transfer copying unit 42 further includes a third data path replica unit 42_3 for transferring the address that is transferred by the second data path replica unit 42_2 through a third address transfer path that copies the load at the output of the second I/O sense amplifier output controlling unit through which the data from the data multiplexer 37 is outputted to output the passed address as the internal address.

Figure 10:
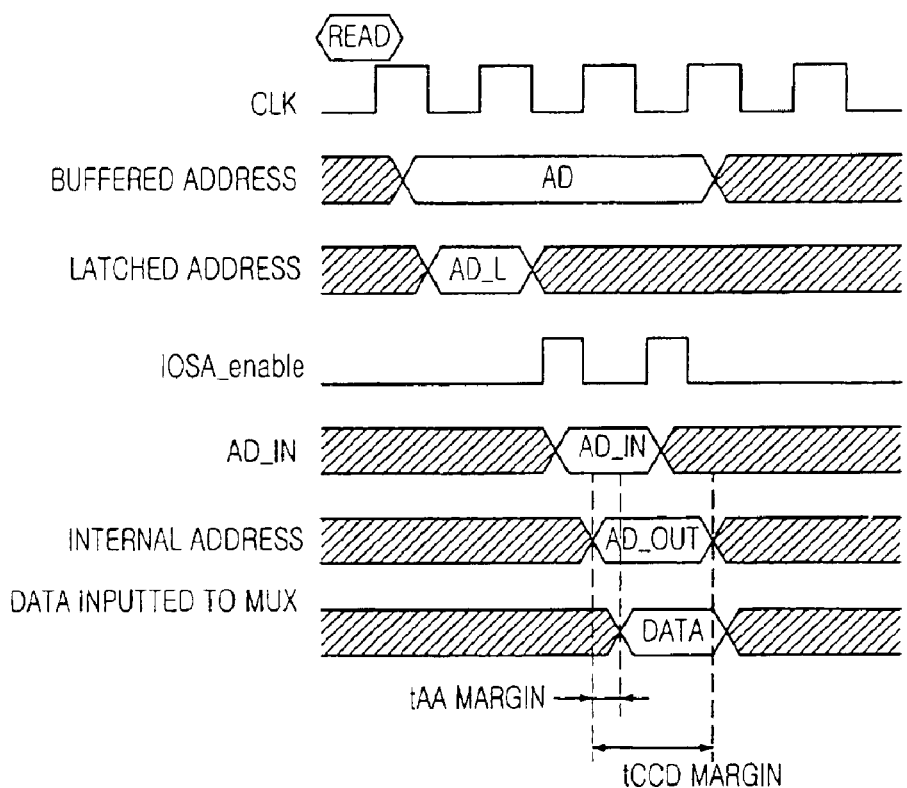
FIG. 10 offers a waveform for explaining the operation of the memory device shown in FIG. 6.

FIG. 10 offers a waveform for explaining the operation of the memory device shown in FIG. 6.

Hereinafter, it will be described for the operation of the memory device in accordance with the embodiment with reference to FIG. 6 to FIG. 10.

First, when a command and an address are inputted to the memory device to read data, the inputted command is buffered in the command buffer 30 and then outputted to the command translating unit 43 in which decodes the inputted command.

Also, the address is buffered in the address buffer 30 and then inputted to the address latching unit 31 which outputs the latched address to the pre-decoder 32 and the timing adjusting unit 42 of the address transferring unit 70.

The pre-decoder 32 decodes the inputted address at first and then outputs the decoded address to the main decoder 33 which decodes the pre-decoded address once again to output it to the memory core 34. The memory core 34 selects one of unit cells depending on the decoded value of the main decoder 33 and then outputs the data that is stored at the selected unit cell to the I/O sense amplifying unit 35.

In turn, the I/O sense amplifying unit 35 senses and amplifies the data signal that is on an I/O line based on the I/O sense amplifier enable signal IOSA_enable that is outputted from the command translating unit 40.

The I/O sense amplifier output controlling unit 36 outputs the inputted data to the data multiplexer 37 in response to the output enable signal IOSA_output.

On the other hand, the address AD_L that is latched by the address latching unit 31 is latched by the address timing adjusting unit 41 based on the I/O sense amplifier enable signal IOSA_enable.

In turn, the address AD_IN that is latched by the address timing adjusting unit 41 passes through the data path replica unit 42 and then inputted to the data multiplexer 37 as the internal address AD_OUT.

The data multiplexer 37 outputs the data that is transferred from the I/O sense amplifier output controlling unit 36 to the data output buffer 38 in response to the internal address AD_OUT. In turn, the data output buffer 38 outputs the data that is transferred from the data multiplexer 37 after adjusting the data by a latency corresponding to the read command to output it to external.

The memory device of the embodiment is capable of keeping the interval between the internal address AD_OUT and the data signal that are inputted from the data multiplexer 37 consistently regardless of variance of power voltage or process change, because the address transfer path through which the address AD_L that is latched by the address latching unit 31 copies the path through which the data is transferred from the memory core 34 to the data multiplexer 37.

Explaining more in detail, while the data that is outputted from the memory core 34 depending on the I/O sense amplifier enable signal IOSA_enable is sensed and amplified, the latched address AD_L is latched from the timing adjusting unit 36.

In turn, the address AD_IN that is outputted from the address timing adjusting unit 36 passes through the data path replica unit 42 that copies the load in transferring the data from the I/O sense amplifier output controlling unit 35 to the data multiplexer 37, and then is outputted to the data multiplexer 37. In this way, the address gets its load as same as the load on the data transfer path, so that the interval between the internal address AD_OUT and the data signal that are inputted to the data multiplexer 37 can be kept consistently regardless of the power voltage change or process change.

Referring to FIG. 10, it shows that a margin of tAA and a margin of tCCD are kept consistently regardless of the power voltage change or process change.

On the other hand, in FIG. 8, there is provided a detailed block diagram of the data path replica unit 42, in which the first data path replica unit 42_1 copies the load on the transfer path of the data that is loaded by the I/O sense amplifier output controlling unit 35, and the second data path replica unit 42_2 copies the load on the data that is inputted to the data multiplexer 37.

On the other hand, the memory device comprises a number of banks to receive data, that is outputted from the I/O sense amplifier output controlling unit (see FIG. 9) in each of the banks, at the data multiplexer 37, and then selectively transfer the data to the data output buffer 38 depending on an output mode(x4, x8, x16).

The third path replica unit 42_3 copies the load on the output of the I/O sense amplifier output controlling unit 36 that is included in another bank at the moment when the data signal is inputted to the data multiplexer 37. Also, wires that are included in the data path replica unit 42 copies the structure of the global input output line Global IO LINE through which the data signal passes.

Accordingly, because the data path replica unit 42 includes all possible factors, i.e., a contact resistor, a wire resistor, or load capacitance, which delays between the I/O sense amplifying unit to the data multiplexer 37, the internal address AD_OUT that passes through the data path replica unit 42 is inputted to the data multiplexer 37, with having a delay as much as the data.

Accordingly, even when the power voltage VDD that is inputted as an operating voltage changes, the margin of tAA or the margin of tCCD will not be reduced because the memory device is able to consistently keep the skew between the address and the data on the transfer paths inside the memory device. Further, when applying the present invention to development of a low power memory device having a lower power voltage VDD, the developing period would be shortened.

The semiconductor memory device according to the present invention can operates at a high speed regardless of variance of the power voltage or process change because it is capable of consistently keeping the skew between the transfer path of the address and the transfer path of the.

Also, the present invention has a benefit for developing a low voltage memory device because the skew between the signal due to the transfer path of the address and the transfer path the data is within an expectable range even when the power voltage changes in the memory device of the present invention.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device comprising:
   a memory core for outputting data corresponding an inputted address;
   a data output buffer for outputting the data that is outputted from the memory core to external;
   data transferring means for transferring the data that is outputted from the memory core to the data output buffer in response to an internal address; and
   address transferring means for receiving the inputted address and passing the received address through an address transfer path that copies a data transfer path through which the data is transferred by the data transferring means to output the passed address as the internal address.

2. The semiconductor memory device as recited in claim 1, wherein the data transferring means includes:
   I/O sense amplifying means enabled by a sense amplifier enable signal for sensing and amplifying the data from the memory core;
   I/O sense amplifier output controlling means for adjusting output timing of the data that is sensed and amplified by the I/O sense amplifying means; and
   a data multiplexer for outputting the data that is outputted by the I/O sense amplifier output controlling means to the data output buffer in response to the internal address.

3. The semiconductor memory device as recited in claim 2, wherein the address transferring means includes:
   address timing adjusting means for receiving and transferring the inputted address in response to the sense amplifier enable signal; and
   data path replica means for passing the inputted address that is transferred by the address timing adjusting means through an address transfer path that copies an data transfer path through which the data is transferred by the data transferring means to output the passed address as the internal address.

4. The semiconductor memory device as recited in claim 3, wherein the address timing adjusting means includes:
   3-stage inverter turned on in response to the sense amplifier enable signal to transfer the inputted address; and a first and a second inverters for latching the output of the 3-stage inverter.

5. The semiconductor memory device as recited in claim 3, wherein the data path replica means includes:

first data path replica means for transferring the inputted address that is transferred by the address timing adjusting means through a first address transfer path that copies the path through which the data is transferred by the first I/O sense amplifier output controlling means; and second data path replica means for transferring the inputted address that is transferred by the first data path replica means through a second address transfer path that copies the path through which the data is transferred by the data multiplexer to output the passed address as the internal address.

6. The semiconductor memory device as recited in claim 5, wherein the data multiplexer is coupled to a second I/O sense amplifier output controlling means included in another bank in addition to the first I/O sense amplifier output controlling means, and the data transfer replica means further includes a third data path replica means for transferring the inputted address that is transferred by the second data path replica means through a third address transfer path that copies the load at the output of the second I/O sense amplifier output controlling means through which the data from the data multiplexer is outputted to output the passed address as the internal address.

7. The semiconductor memory device as recited in claim 3, further comprising command translating means for decoding a command that is inputted from external to generate the sense amplifier enable signal to output the sense amplifier enable signal to the I/O sense amplifying means and the address timing adjusting means.

8. The semiconductor memory device as recited in claim 1, further comprising address latching means for latching the inputted address to transfer the latched address to the memory core or the address transferring means.

* * * * *